United States Patent [19]

Demeure et al.

[11] Patent Number: 6,020,896
[45] Date of Patent: Feb. 1, 2000

[54] METHOD OF SIGNAL PROCESSING APPLICATION GRAPHICAL ENTRY

[75] Inventors: Alain Demeure, Nice; Anne LaFage, Paris, both of France

[73] Assignees: Thomson-CSF; France Telecom, both of Paris, France

[21] Appl. No.: 08/930,574

[22] PCT Filed: Mar. 29, 1996

[86] PCT No.: PCT/FR96/00479

§ 371 Date: Oct. 7, 1997

§ 102(e) Date: Oct. 7, 1997

[87] PCT Pub. No.: WO96/31830

PCT Pub. Date: Oct. 10, 1996

[30] Foreign Application Priority Data

Apr. 7, 1995 [FR] France .................................. 95 04175

[51] Int. Cl.⁷ .................................................. G06F 15/00
[52] U.S. Cl. ............................................................ 345/433
[58] Field of Search .................................... 345/433, 519, 345/520, 525, 526

[56] References Cited

U.S. PATENT DOCUMENTS 4,542,455  9/1985  Demeure ................................ 364/200
4,604,736  8/1986  Demeure ................................ 367/123
5,831,604  11/1998  Gerber ................................... 345/431

*Primary Examiner*—Phu K. Nguyen
*Attorney, Agent, or Firm*—Oblon, Spivak, McClelland, Maier & Neustadt, P.C.

[57] ABSTRACT

Method of signal processing application graphical entry with the aid of a digital computer. The method starts from data structured into tables displayed in the form of Cartesian grids (X, Y, Z, T) by implementing at least one transformation on these data (F), in that a set of elementary transformations is available in library, in that for each transformation, at least one operand application table is compiled at input and at least one result application table is compiled at output, in that an operand array is compiled at input to each elementary transformation and a result array is compiled at output, and in that for each Cartesian coordinate axis, at least two elements of the operand array and of the operand application table on the one hand, of the result array and of the result application table on the other hand are matched up, and in that the affine relations characteristic of the accesses to the tables for signal processing are used to compile, per iteration, with the aid of software included in the graphics tool, on the basis of at least two matches, all of the accesses necessary for the complete execution of the relevant transformation.

8 Claims, 5 Drawing Sheets

METHOD OF SIGNAL PROCESSING APPLICATION GRAPHICAL ENTRY

BACKGROUND OF THE INVENTION

1. Field of the Invention

The present invention relates to a method of signal processing application graphical entry, and in particular to a method of specifying characteristics of circuits for signal processing which calls upon graphical input.

2. Discussion of the Background

In the particular case of the design of integrated circuits for signal processing, there are software tools which are run on workstations and make it possible to define the units making up a chain and to specify their interconnections graphically. These tools are appropriate to a description of processing as pictured by data streams flowing between the units. In the case of signal processing chains, such as those implemented in multisensor detection systems, the data stream picture is inappropriate since the signal has a multidimensional structure. Such is the case for example if L sensors provide firstly the L rows of a matrix whose C columns subsequently feed C computations. Only by structuring the data into tables can this organization of the computations be specified without ambiguity.

Methods making it possible to embody signal processing circuits, in a relatively complex manner, are known from the documents WOA 9106060 (VLSI TECHNOLOGY), IEEE INTERNATIONAL CONFERENCE ON ACOUSTICS SPEECH AND SIGNAL PROCESSING, Apr. 3–6, 1990, ALBUQUERQUE US, pages 1057–1060, XP000146955 GENIN ET AL: "dsp specification using the silage language" and IEEE INTERNATIONAL CONFERENCE ON COMPUTER-AIDED DESIGN, Nov. 11–14, 1991 SANTA CLARA US, pages 272–275, XXP000315186 VANHOOF ET AL: "compiling multidimensional data streams into distributed dsp asic memory".

SUMMARY OF THE INVENTION

The subject of the present invention is a method making it possible to specify signal processing chains especially for the purpose of designing signal processing circuits, but also for the purpose of producing software for existing signal processing machines and to do so regardless of the structure of the signal, be it single- or multidimensional.

The subject of the invention is a method allowing a user to specify digital signal processing chains by means of a graphics input and a digital computer with which there is associated a library containing a set of elementary transformations used in signal processing, characterized in that the user structures the data to be processed into at least one table displayed in the form of cartesian grids, the dimensions of each table corresponding to physical quantities, in that for each transformation he graphically compiles an operand application table and a result application table, and chooses from the library an elementary transformation together with its input array and output array, these arrays corresponding to the number of samples defining the elementary function, in that he matches, for each cartesian coordinate axis, at least two elements of the operand array and of the operand application table on the one hand, of the result array and of the result application table on the other hand, and in that the computer uses the affine relations characteristic of the accesses to the tables for signal processing in order completely to execute the transformation by iterating the elementary transformation as many times as necessary for the result table to be entirely filled with collections of points identical to the collection of points corresponding to the output array.

This is possible by virtue of the fact that the relations defining the matches between the tables and the arrays and the iterations for the filling of the tables are linear. These matches are equivalent to affine relations. Thus, by virtue of the invention, it is possible via a very simple sequence of operations, to specify very complex digital signal processing chains.

BRIEF DESCRIPTION OF THE DRAWINGS

The present invention will be better understood on reading the detailed description of an embodiment taken by way of non-limiting example and illustrated by the appended drawing in which.

DISCUSSION OF THE PREFERRED EMBODIMENTS

A signal processing application generally operates on sample streams provided by coders transforming analogue quantities into digital quantities.

Such is the case, in particular, in radars and sonars.

To be able to implement the invention, the data to be processed are structured into tables having one or more dimensions, these dimensions being either finite or infinite. The dimensions of these tables correspond to physical quantities, in particular spatial, temporal or frequential quantities. In the case of a temporal dimension, the size may be infinite.

An application consists of a sequence of transformations. The front-end transformation operates on a table filled with the samples provided by the coders. Gradually, the result table for one transformation is used as operand table for the following transformation(s).

Figure 1:
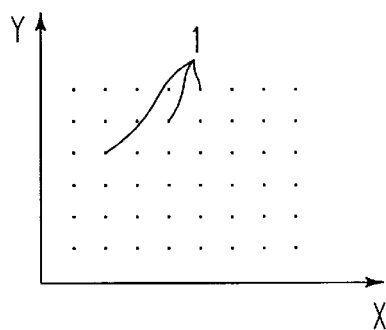
FIG. 1 is a diagram illustrating the principle of graphical representation of a table.
Figure 2:
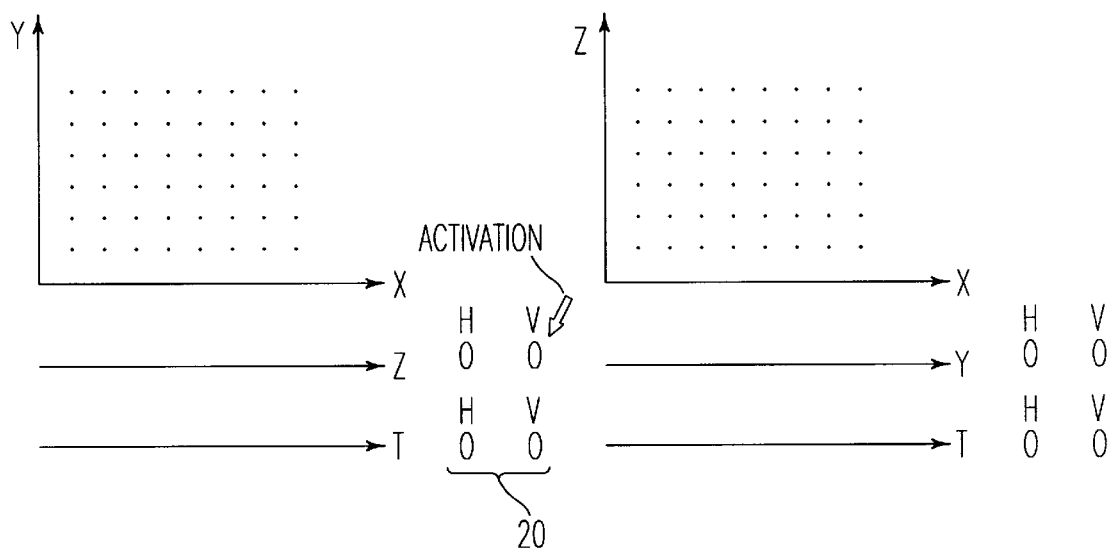
FIG. 2 is a diagram illustrating the principle of graphical representation of a three-dimensional table, in accordance with the invention.

Represented in FIG. 1 is the principle of graphical representation of a table. This representation employs the classical geometrical view of a cartesian grid in which only the points 1 with integer coordinates are portrayed. The axes of the grid portray the dimensions (parameters such as time, frequency, number of sources, etc.), and the graphics tool allows them to be allocated a name, X or Y for example, and a size. In the case in which the number of dimensions is greater than 2, additional axes are adjoined in parallel under the horizontal axis. With each additional axis there are associated two "buttons" 20 (in graphics editor terms) allowing its exchange with the horizontal axis (H) or vertical axis (V) of the Cartesian grid. This possibility is illustrated in FIG. 2.

Figure 3:
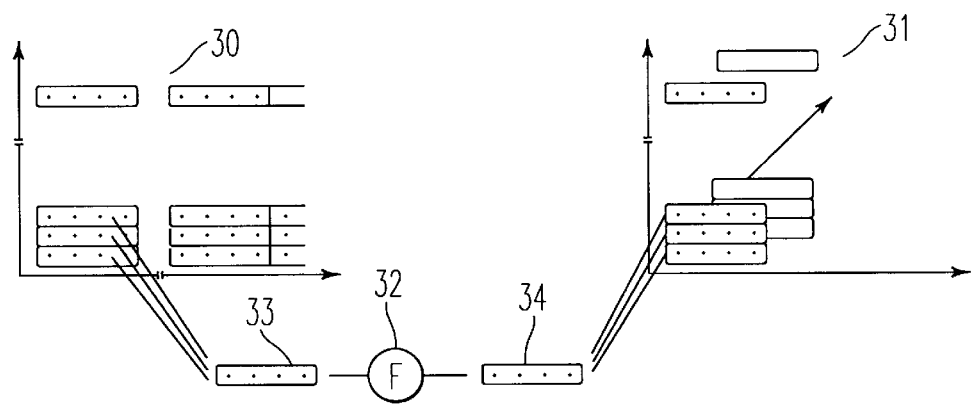
FIGS. 3 to 5 are diagrams illustrating respectively, in accordance with the invention, the principle of the entry of a transformation, the principle of setup access and the principle of blocking access.

Represented in FIG. 3 is the principle of entering a single transformation (the specifying of an application requires as a general rule the entering of several transformations). This figure depicts an operand application table 30, a result application table 31, as well as an elementary application 32 together with its input arrays 33 and its output arrays 34. The elementary application implements an elementary transformation symbolized by F, for example an FFT, operating on a sequence of time samples so as to derive a sequence of frequency lines. This representation assumes that at least the result array is structured as a table and that, in order completely to execute the transformation, the elementary transformation is iterated as many times as necessary for the result table to be entirely filled with collections of points identical to the collection of points corresponding to the output array. Everything happens as if, at each iteration of the elementary transformation, one "block" contributing to the construction of the result table were added. A block is equivalent to the collection of points corresponding to an array placed (or "mapped") in a table. The position at which the result block is placed defines the position of the corresponding operand block.

Accesses to the tables are governed during signal processing by affine relations, this making it possible to limit to the utmost the amount of information which has to be added to FIG. 3 to completely specify the execution of a transformation, graphically.

Figure 4:
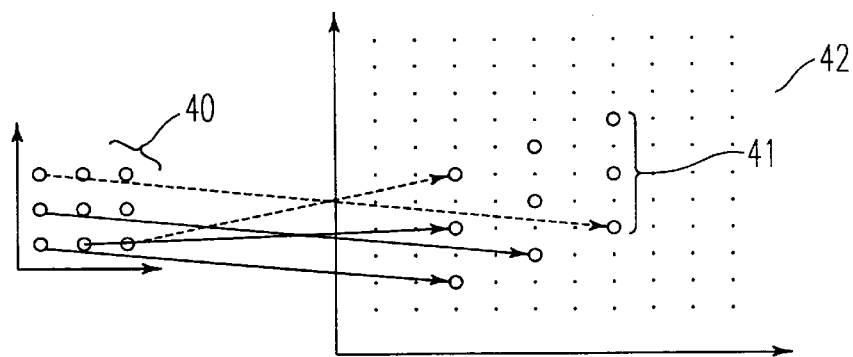

To explain clearly the principle of this specification, two types of access will be distinguished, it being understood that this distinction is not characteristic of the invention as such. A first type of access will specify how a block is oriented in the table to which it is applied and, as the case may be, sub-samples it. FIG. 4 illustrates the matching of the components of the array 40 with the components of the table 42, making up the block 41. Two points are sufficient for each dimension, the dashes indicating extrapolation. For each dimension, on the basis of these two points, software built into the graphics tool computes the linear relation which makes it possible to pass from the coordinates of the components of the array to those of the table. One component is advantageously common to all the dimensions and allows a saving of one point per dimension. The specifying of this first type of access is referred to as setup.

How the position of a result block controls the position of the operand blocks, and/or of the other result blocks if there are multiple results tables remains to be defined. It will be observed that the setup having been specified, the positions of all the components of a block are deduced from the position of a single component. It therefore suffices to define how the position of a single component of the result block controls the position of a single component of any other block.

Figure 5:
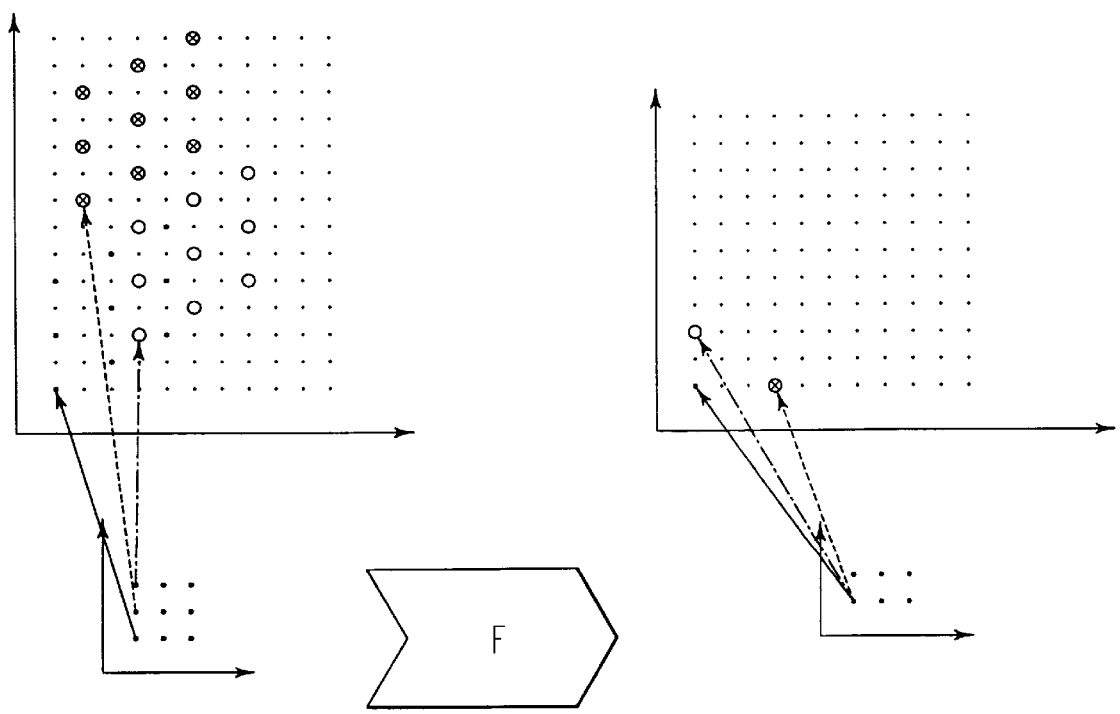

As in the case of setup, the specifying of the accesses of second type is done by matching the positions of the operand array at the rate of two positions per dimension of the result table: this is illustrated by FIG. 5. A position is completely described by the position of a single component of the array. The specifying of this second type of access is referred to as blocking.

Figure 6:
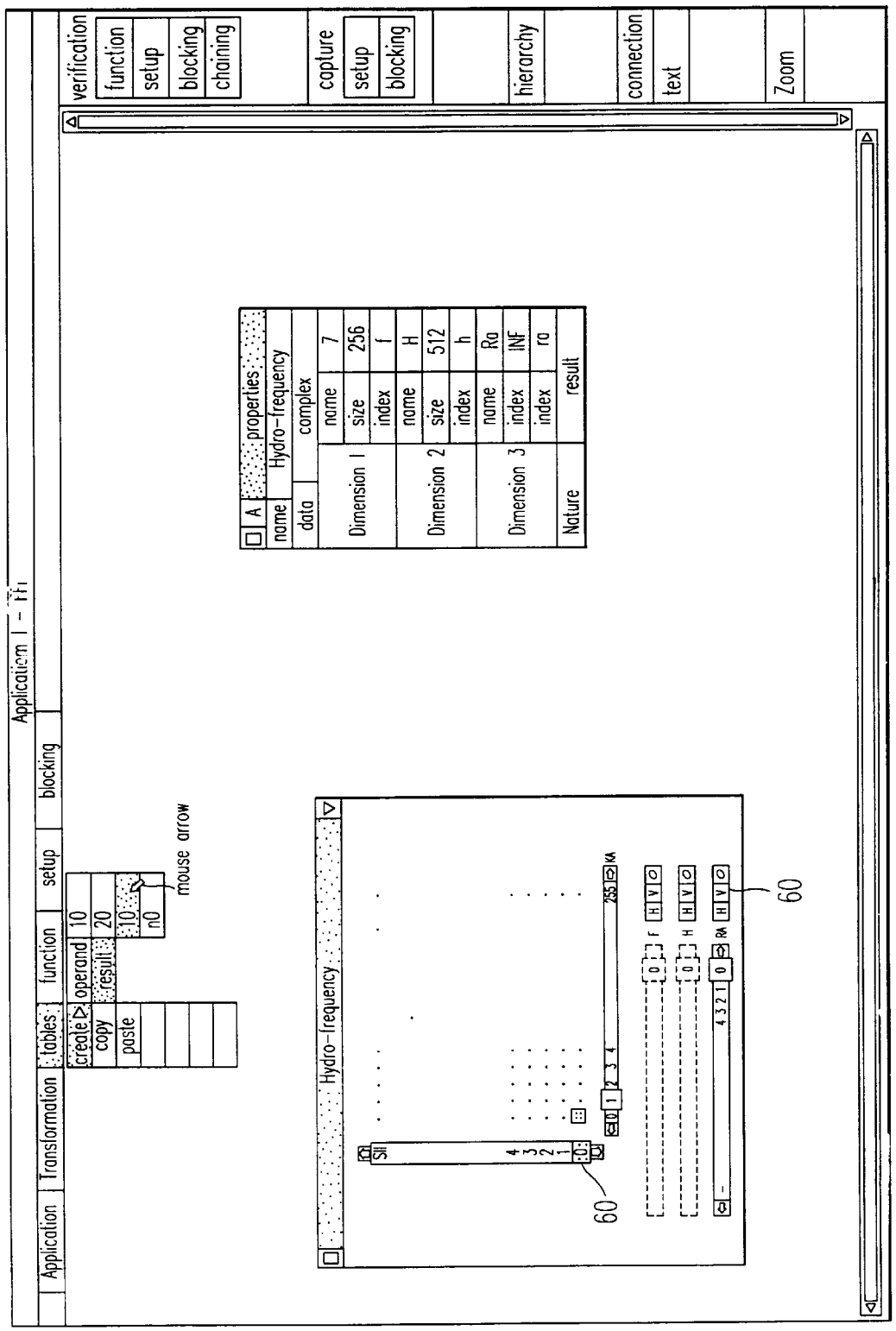
FIGS. 6 to 8 are views of the screen of the graphics entry terminal when, in accordance with the invention the user, respectively, creates a table, undertakes setup access and undertakes blocking access.
Figure 7:
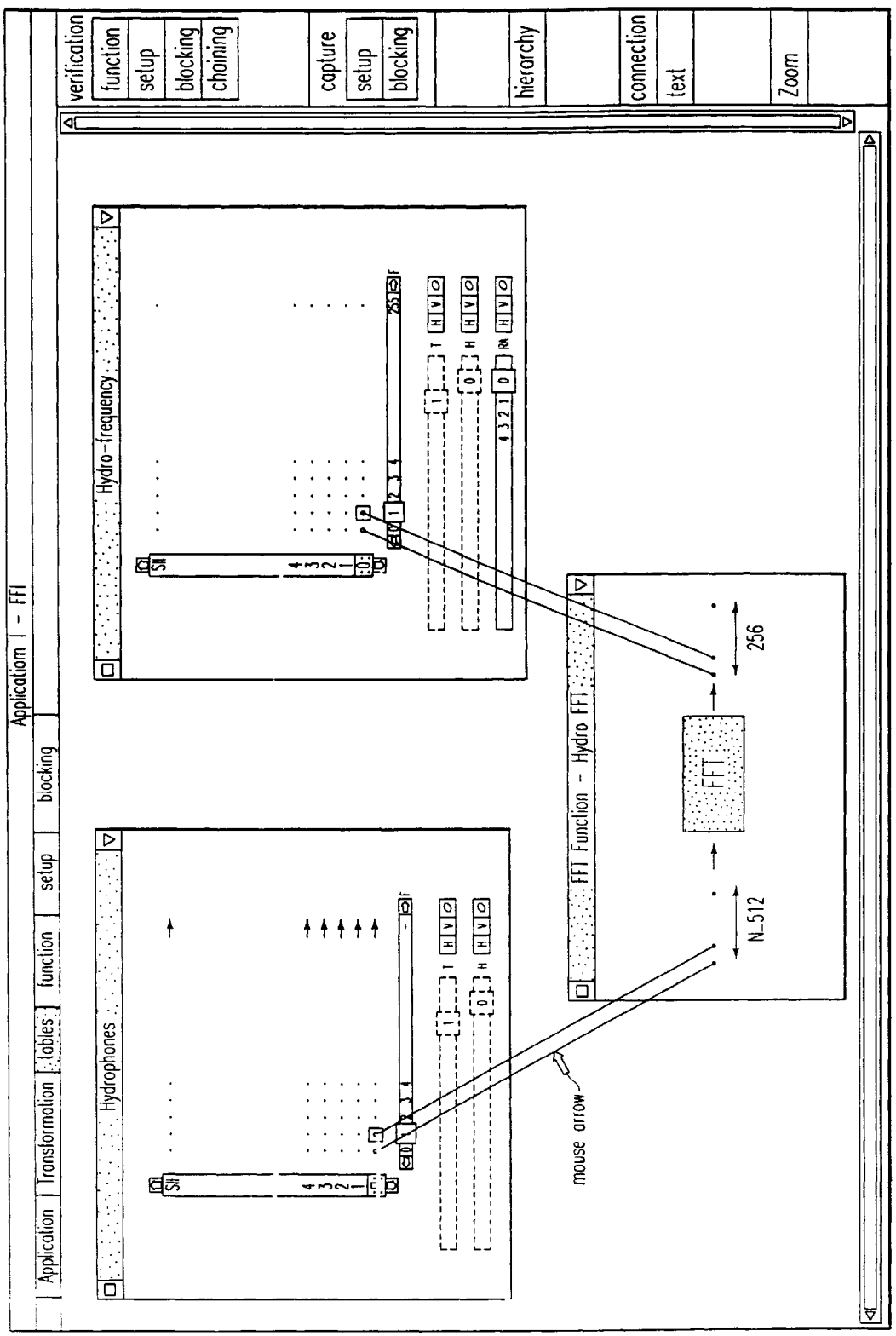
Figure 8:
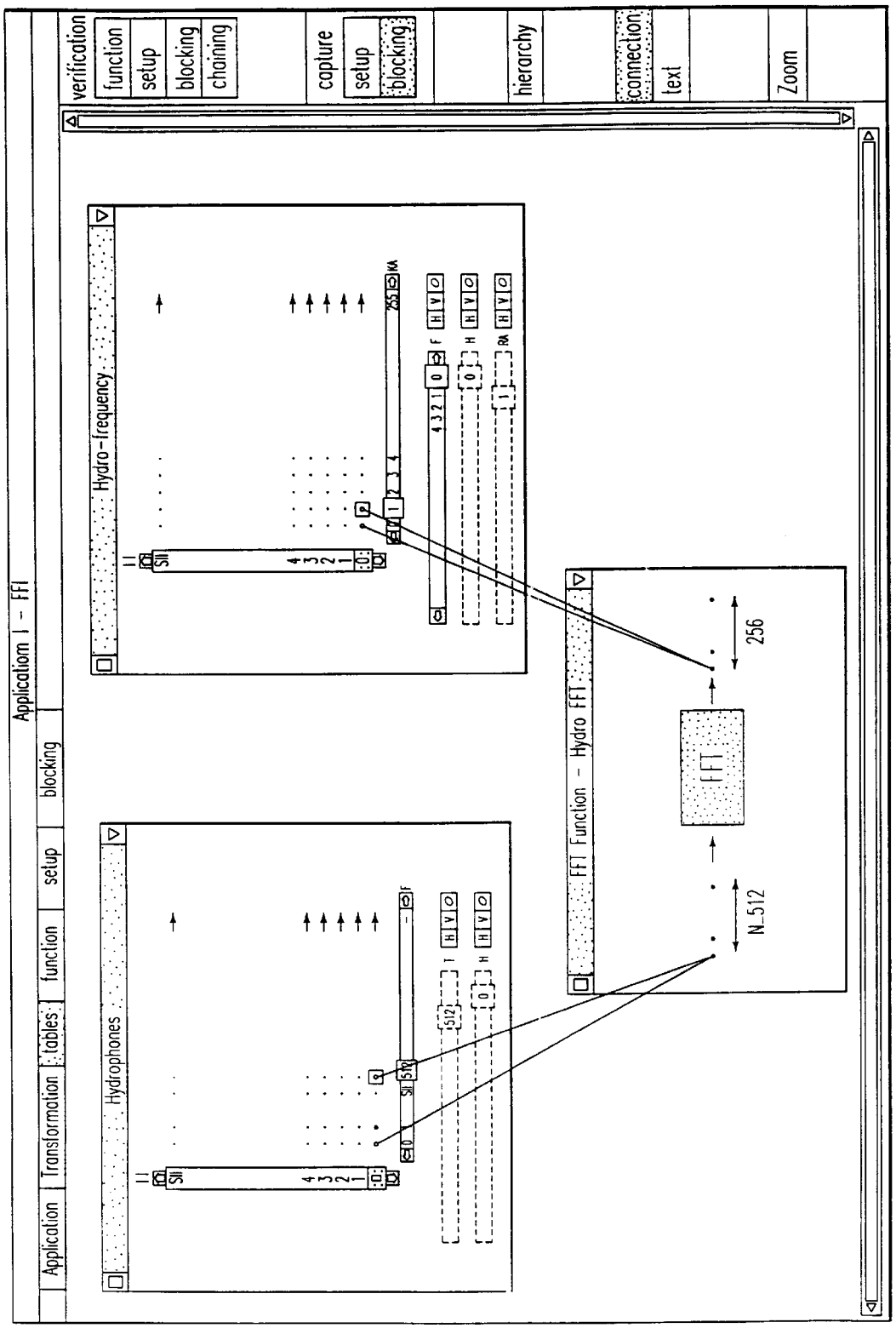

Represented in FIGS. 6 to 8 are examples of screen views produced by the graphics tool of the invention.

FIG. 6 represents a view of the entry screen during the creation of an operand table relating to a signal processing application.

The mouse will be used to click on "tables" and then on "create", "operand" and "3D" in the drop-down menu at the top of the screen. On the screen there appears on the one hand a window entitled, in the present case, "Hydro-Frequency" (for "hydrophone No." and "Frequency") and, on the other hand, on another window entitled "properties" which is filled in using the keyboard. The "Hydro-Frequency" window is occupied, in its upper part, by the two coordinate axes H (hydrophone No.—along the ordinate) and F (frequency). In the lower part of this window are the locations for "laying out" the three coordinate axes whose use is envisaged (F, H and RA, the latter corresponding to recurrence). In the example of FIG. 6, the axes F and H being used, their locations in the lower part of the window are represented by broken lines. Only the axis RA, placed in reserve, is represented by a continuous line. To replace one axis by another, with a view to determining another transformation, for example to replace the axis H by the axis RA, it suffices to click on the button 60 situated to the right of the axis RA and marked V for "vertical": the switch is then made instantaneously. Each axis is furnished with a cursor 60 enabling a current point to be positioned in the table by clicking on the desired coordinates.

The second window takes the form of a simplified table containing the essential data relating to the available coordinate axes, namely, for each of them, its name, its size (number of elements for a finite period, or else infinite size) , and index (i.e. F, H, RA etc. as indicated earlier), as well as the nature of the table created (operand or result).

After additional specification actions (not described), FIG. 7 represents a view of the entry screen during access referred to as setup. Represented in this FIG. 7 are a "Hydro Frequency" window, a "Hydrophone" window, (which represents a result table obtained in the same way as the operand table of FIG. 6) , the latter portraying the axes H and T (time, of infinite size) and a "FFT Function-Hydro FFT" window which represents an elementary FFT function together with the number of input points and the number of output points (here, 512 and 256 respectively). The mouse is used to click on the "setup" and "connection" functions in order to activate them. For a given transformation, here an FFT, by clicking and holding the mouse, the points are joined between on the one hand the operand array (512 FFT points) and the operand table and on the other hand between the result array (256 FFT points) and the result table ("Hydro Frequency").

Finally FIG. 8 represents a view of the entry screen during the access referred to as blocking by a result dimension. This FIG. 8 includes the same windows as FIG. 7, the axis RA replacing the axis in the "Hydro-Frequency" window. The mouse is used to click on the "Blocking" and "Connection" functions in order to activate them. As before, the mouse is used to join an operand array joint to a point of the operand table, and then the same thing is done on the result side.

When the complete application has been specified with the method just described, the information captured during entry is transformed into codes for digital computers. This generating of codes is done in a conventional manner and will therefore not be described here.

We claim:

1. Method allowing a user to specify digital signal processing chains by means of a graphics input and a digital computer with which there is associated a library containing a set of elementary transformations used in signal processing, characterized in that the user structures the data to be processed into at least one table displayed in the form of Cartesian grids (X, Y, Z, T), the dimensions of each table corresponding to physical quantities, in that for each transformation said user graphically compiles an operand application table and a result application table, and chooses from the library an elementary transformation together with the input array and output array, these arrays corresponding to the number of samples defining the elementary function, in that said user matches, for each cartesian coordinate axis, at least two elements of the operand array and of the operand application table on the one hand, of the result array and of the result application table on the other hand, and in that the computer uses the affine relations characteristic of the accesses to the tables for signal processing in order completely to execute the transformation by iterating the elementary transformation as many times as necessary for the result table to be entirely filled with collections of points identical to the collection of points corresponding to the output array.

2. Method according to claim 1, for a signal processing chain, characterized in that the user carries out several consecutive transformations by using the result table from one transformation as operand table for the following transformation(s).

3. Method according to claim 2, characterized in that when a processing operation involves more than two dimensions, the unused dimensions in the tables displayed on the screen of the graphics tool are displayed alongside these tables and can be activated with the aid of "buttons".

4. Method according to claim 3, characterized in that when all the transformations relating to an application have been determined, the computer transforms the information captured in the course of entry into digital codes.

5. Method according claim 2, characterized in that when all the transformations relating to an application have been determined, the computer transforms the information captured in the course of entry into digital codes.

6. Method according to claim 1, characterized in that when a processing operation involves more than two dimensions, the unused dimensions in the tables displayed on the screen of the graphics tool are displayed alongside these tables and can be activated with the aid of "buttons".

7. Method according to claim 6, characterized in that when all the transformations relating to an application have been determined, the computer transforms the information captured in the course of entry into digital codes.

8. Method according to claim 1, characterized in that when all the transformations relating to an application have been determined, the computer transforms the information captured in the course of entry into digital codes.

* * * * *